United States Patent
Ran et al.

(10) Patent No.: US 12,293,984 B2
(45) Date of Patent: May 6, 2025

(54) METHOD FOR PACKAGING STACKING FLIP CHIP

(71) Applicant: HEBEI BEIXIN SEMICONDUCTOR TECHNOLOGY CO., LTD, Shijiazhuang (CN)

(72) Inventors: Honglei Ran, Shijiazhuang (CN); Kui Zhang, Shijiazhuang (CN); Shanbin Xi, Shijiazhuang (CN); Hao Peng, Shijiazhuang (CN); Huaguang Liu, Shijiazhuang (CN); Hailong Zhao, Shijiazhuang (CN)

(73) Assignee: Hebei Beixin Semiconductor Technology Co., Ltd., Shijiazhuang (CN)

( * ) Notice: Subject to any disclaimer, the term of this patent is extended or adjusted under 35 U.S.C. 154(b) by 0 days.

(21) Appl. No.: 18/884,085

(22) Filed: Sep. 12, 2024

(65) Prior Publication Data

US 2025/0006692 A1    Jan. 2, 2025

Related U.S. Application Data

(63) Continuation of application No. PCT/CN2023/103877, filed on Jun. 29, 2023.

(30) Foreign Application Priority Data

Nov. 24, 2022  (CN) .......................... 202211478794.3

(51) Int. Cl.
    *H01L 23/00*  (2006.01)
    *H01L 21/56*  (2006.01)

(52) U.S. Cl.
    CPC ............ *H01L 24/83* (2013.01); *H01L 21/563* (2013.01); *H01L 24/27* (2013.01); *H01L 24/81* (2013.01);
    (Continued)

(58) Field of Classification Search
    CPC ......... H01L 21/563; H01L 2224/02126; H01L 2224/02315; H01L 2224/20166;
    (Continued)

(56) References Cited

U.S. PATENT DOCUMENTS

| 5,659,203 A * | 8/1997 | Call ...................... H01L 23/295 |
| | | 257/E21.503 |
| 6,921,860 B2 * | 7/2005 | Peterson ................. H01L 24/11 |
| | | 257/E23.021 |

(Continued)

FOREIGN PATENT DOCUMENTS

| CN | 101038898 A | 9/2007 |
| CN | 102097397 A | 6/2011 |

(Continued)

OTHER PUBLICATIONS

International Search Report and Written Opinion received in Patent Cooperation Treaty Application No. PCT/CN2023/103877, Oct. 11, 2023, 15 pages.

(Continued)

*Primary Examiner* — David A Zarneke
(74) *Attorney, Agent, or Firm* — AP3 Law Firm PLLC

(57) ABSTRACT

The present application is applicable to the field of semiconductor technology and provides a method for packaging stacking a flip chip, which includes: placing a filling template on a substrate, the filling template being provided with a through hole of a preset pattern; filling a filling material into the through hole of the filling template, and after the filling material being formed on the substrate, removing the filling template; placing a chip with solder balls on the substrate formed with the filling material, such that at least a portion of the solder balls being covered by the filling material; and connecting the chip to the substrate through the solder balls, and curing the filling material with air gaps (Continued)

formed between the at least a portion of the solder balls covered with the filling material.

3 Claims, 16 Drawing Sheets

(52) U.S. Cl.
CPC .............. *H01L 24/92* (2013.01); *H01L 24/29* (2013.01); *H01L 24/32* (2013.01); *H01L 2224/02126* (2013.01); *H01L 2224/02135* (2013.01); *H01L 2224/02166* (2013.01); *H01L 2224/02175* (2013.01); *H01L 2224/02235* (2013.01); *H01L 2224/02245* (2013.01); *H01L 2224/03013* (2013.01); *H01L 2224/10126* (2013.01); *H01L 2224/10145* (2013.01); *H01L 2224/10156* (2013.01); *H01L 2224/10175* (2013.01); *H01L 2224/11013* (2013.01); *H01L 2224/2747* (2013.01); *H01L 2224/2929* (2013.01); *H01L 2224/32014* (2013.01); *H01L 2224/32053* (2013.01); *H01L 2224/81191* (2013.01); *H01L 2224/83104* (2013.01); *H01L 2224/83192* (2013.01); *H01L 2224/83948* (2013.01); *H01L 2224/9202* (2013.01); *H01L 2224/92125* (2013.01)

(58) Field of Classification Search
CPC . H01L 2224/02175; H01L 2224/02235; H01L 2224/02245; H01L 2224/03013; H01L 2224/11013; H01L 2224/10156; H01L 2224/10175; H01L 2224/10126; H01L 2224/10145
See application file for complete search history.

(56) References Cited

U.S. PATENT DOCUMENTS

| | | | | |
|---|---|---|---|---|
| 7,919,357 | B2* | 4/2011 | Sawada | H01L 24/11 438/455 |
| 8,193,624 | B1* | 6/2012 | Sohn | H01L 21/563 257/725 |
| 8,501,583 | B2* | 8/2013 | Kitae | H01L 24/81 438/455 |
| 8,587,134 | B2* | 11/2013 | Im | H01L 24/73 257/746 |
| 9,006,890 | B2* | 4/2015 | Hu | H01L 23/3142 257/737 |
| 9,241,403 | B2* | 1/2016 | Pares | H01L 25/50 |
| 9,627,346 | B2* | 4/2017 | Hsu | H01L 23/3128 |
| 2004/0169275 | A1 | 9/2004 | Danvir et al. | |
| 2005/0287705 | A1 | 12/2005 | Yang | |
| 2007/0215927 | A1* | 9/2007 | Kuramochi | H01L 24/27 257/E21.503 |
| 2008/0122053 | A1 | 5/2008 | Ofner et al. | |
| 2008/0277802 | A1* | 11/2008 | Tsai | H01L 21/563 257/778 |
| 2009/0159651 | A1 | 6/2009 | Sunohara et al. | |
| 2016/0086902 | A1 | 3/2016 | Lu et al. | |
| 2021/0408339 | A1* | 12/2021 | Agarwal | H01L 21/563 |
| 2023/0084360 | A1* | 3/2023 | Chi | H01L 23/3171 257/783 |

FOREIGN PATENT DOCUMENTS

| | | |
|---|---|---|
| JP | H0677228 A | 3/1994 |
| JP | H06204291 A | 7/1994 |
| JP | 2002184804 A | 6/2002 |
| JP | 2003142523 A | 5/2003 |
| JP | 2004254068 A | 9/2004 |
| JP | 2008034868 A | 2/2008 |
| JP | 2008112835 A | 5/2008 |
| JP | 2011061175 A | 3/2011 |
| JP | 2012027644 A | 2/2012 |

OTHER PUBLICATIONS

Notice of First Examination Opinion received in Chinese Application No. 202211478794.3, dated Jan. 19, 2023.
Notice of Grant of Invention Patent received in Chinese Application No. 202211478794.3, dated Feb. 6, 2023.

* cited by examiner

METHOD FOR PACKAGING STACKING FLIP CHIP

CROSS-REFERENCE TO RELATED APPLICATIONS

This application is a continuation application of International Application No. PCT/CN2023/103877, filed on Jun. 29, 2023 and entitled "method for packaging stacking flip chip" which claims priority to Chinese Patent Application No. CN 202211478794.3, filed on Nov. 24, 2022 and entitled "method for packaging stacking flip chip". The disclosures of the aforementioned applications are hereby incorporated herein by reference in their entireties.

TECHNICAL FIELD

The present application belongs to the technical field of semiconductor and particularly relates to a method for packaging stacking a flip chip.

BACKGROUND

The flip chip is a packaging technology that involves planting balls on the chip, flipping the chip, placing the chip on a substrate through a surface mounting technology, using a heating process to melt solder balls, and forming an interconnection between the chip and the substrate, which is conducive to achieve a high-density packaging of the chip. Due to the differences in characteristics between the materials of the solder balls, the chip and the substrate, significant thermal and mechanical stresses are generated at the solder balls during product service, resulting in lower packaging reliability. Therefore, bottom fillers are usually filled in the gaps between the solder balls and the substrate to improve fatigue life and reliability of the solder balls.

However, in some special application scenarios, such as devices with high-frequency communication requirement, when using flip chip technology to package semiconductor structure, there is a problem of filling the bottom fillers, which improves the reliability of the semiconductor packaging structure while reducing the electrical performance of the semiconductor packaging structure.

SUMMARY

These and other problems are generally solved or circumvented, and technical advantages are generally achieved, by embodiments of the present application which provide a method for packaging stacking a flip chip.

Technical Problems

The present application provides a method for packaging stacking a flip chip to simultaneously improve the reliability of the semiconductor packaging structure and the electrical performance of high-frequency signals of the semiconductor packaging structure, solving the problem of reducing the electrical performance of the semiconductor packaging structure when filling the bottom fillers.

Technical Solutions

The present application is implemented through the following technical solution:

In a first aspect, embodiments of the present application provides a method for packaging stacking a flip chip, including: placing a filling template on a substrate, the filling template being provided with a through hole of a preset pattern; filling a filling material into the through hole of the filling template, and after the filling material being formed on the substrate, removing the filling template; placing a chip with solder balls on the substrate formed with the filling material, such that at least a portion of the solder balls being covered by the filling material; and connecting the chip to the substrate through the solder balls, and curing the filling material with air gaps formed between the at least a portion of the solder balls covered with the filling material.

Combining the first aspect, in some possible implementation, the solder balls on the chip are covered by the filling material; a thickness of the filling material covering the solder balls uniformly decreases from a periphery of the chip to a middle of the chip.

Combining the first aspect, in some possible implementation, the thickness of the filling material covering the solder balls located on the periphery of the chip is greater than a thickness of the filling material covering the solder balls located in the middle of the chip.

Combining the first aspect, in some possible implementation, the solder balls located on a periphery of the chip are covered by the filling material, and the solder balls located in a middle of the chip are not covered by the filling material.

Combining the first aspect, in some possible implementation, after connecting the chip to the substrate through the solder balls, the method further includes: filling a preset area between the chip and the substrate with the filling material, such that an air cavity is formed in a middle between the chip and the substrate, the preset area being an area between the solder balls located on a most periphery and a boundary of the chip.

Combining the first aspect, in some possible implementation, a thickness of the filling material is less than or equal to half of a difference between a distance between centers of two adjacent solder balls and a diameter of one solder ball.

Combining the first aspect, in some possible implementation, the filling material and the solder balls are tightly fitted without gaps.

Combining the first aspect, in some possible implementation, the filling material is a polymer composite material includes an epoxy resin matrix, a curing agent, and a promoter.

In a second aspect, embodiments of the present application provides a method for packaging stacking a flip chip, including: placing a dam with a preset shape on a substrate; connecting a chip to the substrate through solder balls on the chip, the solder balls on a periphery of the chip being located outside an area enclosed by the dam, the solder balls located in a middle of the chip being located within the area enclosed by the dam, and gaps being providing between each solder ball on the chip; filling a preset area between the chip and the substrate with the filling material, the preset area being an area outside the dam; and heating and curing the filling material.

Combining the second aspect, in some possible implementation, the filling material is a polymer composite material includes an epoxy resin matrix, a curing agent, and a promoter.

In a third aspect, embodiments of the present application provides a method for packaging stacking a flip chip, including: welding solder joints at a preset position on a substrate for solder ball bonding; uniformly coating a filling material around at least a portion of solder balls on a chip and around at least a portion of the solder joints on the substrate; bonding the solder joints and the solder balls such that the at least a portion of the solder balls is covered by the filling material, and gaps are provided between the at least a portion of the solder balls covered with the filling material; and heating and curing the filling material, and after heating and curing the filling material, the method further includes: filling a preset area between the chip and the substrate with the filling material, such that an air cavity is formed in a middle between the chip and the substrate, the preset area being an area between the solder balls located on a most periphery and a boundary of the chip.

Combining the third aspect, in some possible implementation, the solder balls on the chip and the solder joints on the substrate are uniformly coated with the filling material.

Combining the third aspect, in some possible implementation, the solder balls located on the most periphery of the chip and the solder joints located on a most periphery of the substrate are uniformly coated with the filling material, and the solder balls located on a middle of the chip and the solder joints located in a middle of the substrate are not coated with the filling material.

Combining the third aspect, in some possible implementation, a thickness of the filling material covering the solder balls uniformly decreases from a periphery of the chip to a middle of the chip; and a thickness of the filling material around the solder joints on the substrate is the same as that of the corresponding filling material covering the solder balls.

Combining the third aspect, in some possible implementation, a thickness of the filling material covering the solder balls located on the periphery of the chip is greater than a thickness of the filling material covering the solder balls located in the middle of the chip; and a thickness of the filling material around the solder joints on the substrate is the same as that of the corresponding filling material covering the solder balls.

Combining the third aspect, in some possible implementation, a thickness of the filling material is less than or equal to half of a difference between a distance between centers of two adjacent solder balls and a diameter of one solder ball.

Combining the second aspect, in some possible implementation, the filling material is a polymer composite material includes an epoxy resin matrix, a curing agent, and a promoter.

It is apparent to those of ordinary skill in the art that the general description above and the detailed description in the following text are only illustrative and explanatory, and cannot limit this specification.

Advantageous Effects of the Disclosure

The beneficial effect of the first aspect is that by covering the solder balls with the filling material through the filling template, at least a portion of the solder balls are covered by the filling material, and the surrounding solder balls are covered by the filling material to allow air to circulate, improving the heat dissipation of the middle solder balls. At least a portion of the solder balls are covered by the filling material and the thickness of the filling material is set, which not only improves the reliability of the semiconductor packaging structure, but also improves the electrical performance of the high-frequency signal of the semiconductor packaging structure.

The beneficial effect of the second aspect is that by using a preset shaped dam, the filling material can only be filled outside the dam, improving the reliability of semiconductor packaging structures. An air cavity is formed in the middle, and its presence improves the electrical performance of high-frequency signals in semiconductor packaging structures.

The beneficial effect of the third aspect is to apply filling material around at least a portion of solder joints on the substrate and at least a portion of solder balls on the chip, and then connect the solder balls and solder joints through bonding, allowing the air around the middle solder balls to circulate and improving the heat dissipation of the middle solder balls. This not only improves the reliability of the semiconductor packaging structure, but also enhances the electrical performance of the high-frequency signal of the semiconductor packaging structure.

BRIEF DESCRIPTION OF THE DRAWINGS

In order to provide a clearer explanation of the technical solution in the embodiments of the present application, a brief introduction will be given below to the accompanying drawings required in the embodiments or prior art descriptions. It is evident that the accompanying drawings in the following description are only some embodiments of the present application. For those skilled in the art, other accompanying drawings can be obtained based on these drawings without the need for creative labor.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

In the following description, specific details such as specific system architecture, technology, etc. are proposed for the purpose of illustration rather than limitation, in order to thoroughly understand the embodiments of the present application. However, those skilled in the art should be aware that this application can also be implemented in other embodiments without these specific details. In other cases, detailed descriptions of well-known systems, devices, circuits, and methods may be omitted to avoid unnecessary details hindering the description of the present application.

It is apparent to those of ordinary skill in the art that when used in the present application and the accompanying claims, the term "including" indicates the presence of the described features, whole, step, operation, elements, and/or components, but does not exclude the presence or addition of one or more other features, whole, step, operation, elements, components, and/or sets thereof.

It is apparent to those of ordinary skill in the art that the terms "and/or" used in the description of the present application and the accompanying claims refer to any combination and all possible combinations of one or more of the related listed items, and include these combinations.

As used in the description of the present application and the accompanying claims, the term "if" may be interpreted in context as "when" or "once" or "in response to determination" or "in response to detection". Similarly, the phrases "if determined" or "if detected [described condition or event]" can be interpreted according to context as meaning "once determined" or "in response to determination" or "once detected [described condition or event]" or "in response to detected [described condition or event]".

Furthermore, in the description of the present application and the accompanying claims, the terms "first", "second", "third", etc. are only used to distinguish the description and cannot be understood as indicating or implying relative importance.

The reference to "one embodiment" or "some embodiments" described in the description of the present application means that specific features, structures, or features described in conjunction with the embodiments are included in one or more embodiments of the present application. Therefore, the statements "in one embodiment", "in some embodiments", "in other embodiments", "in other embodiments", etc. that appear differently in this description do not necessarily refer to the same embodiment, but rather mean "one or more but not all embodiments", unless otherwise emphasized. The terms "including", "including", "having", and their variations all mean "including but not limited to", unless otherwise emphasized. "Multiple" refers to two or more quantities, while "several" refers to one or more quantities.

Figure 1:
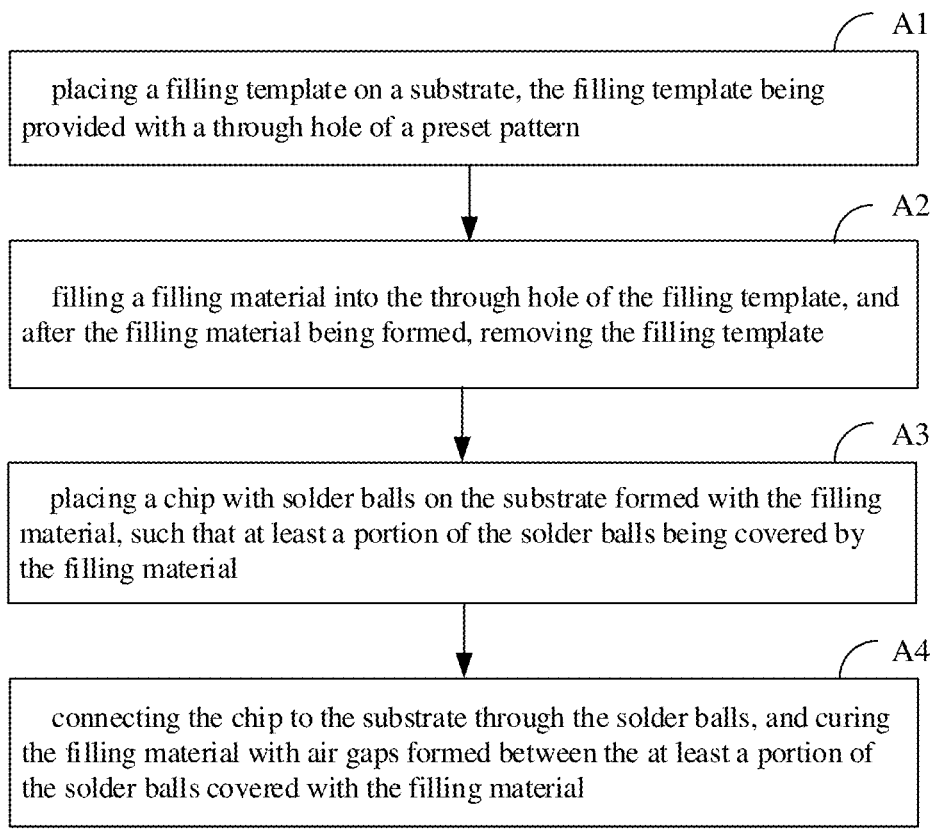
FIG. 1 is a flowchart of a method for packaging stacking a flip chip provided in an embodiment of the present application.

FIG. 1 is a schematic flowchart of a method for packaging stacking a flip chip provided in an embodiment of the present application. Referring to FIG. 1, a detailed description of the method for packaging stacking the flip chip is as follows:

Step A1, placing a filling template on a substrate, the filling template being provided with a through hole of a preset pattern.

Figure 2:
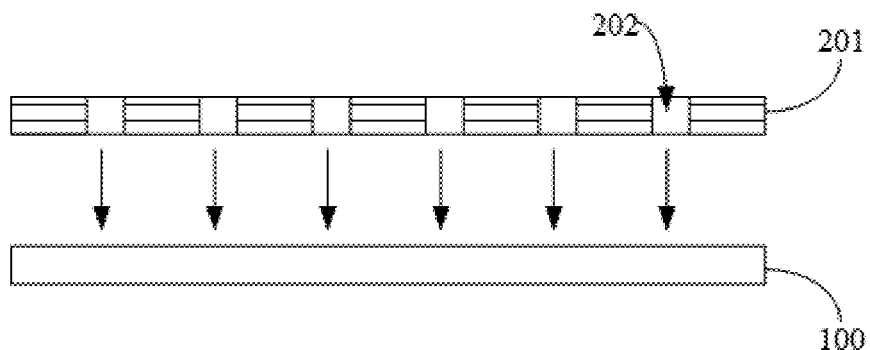
FIG. 2 is a partial step schematic diagram of a method for packaging stacking a flip chip provided in an embodiment of the present application.

As shown in FIG. 2, a through hole 202 with a preset pattern is set on the filling template 201, and the cross-sectional shape of the through hole 202 is set as needed. Place the filling template 201 on the substrate 100, that is to say, so that the filling template 201 presents a stacked posture with the substrate 100.

Step A2, filling a filling material into the through hole of the filling template, and after the filling material being formed on the substrate, removing the filling template.

Figure 3:
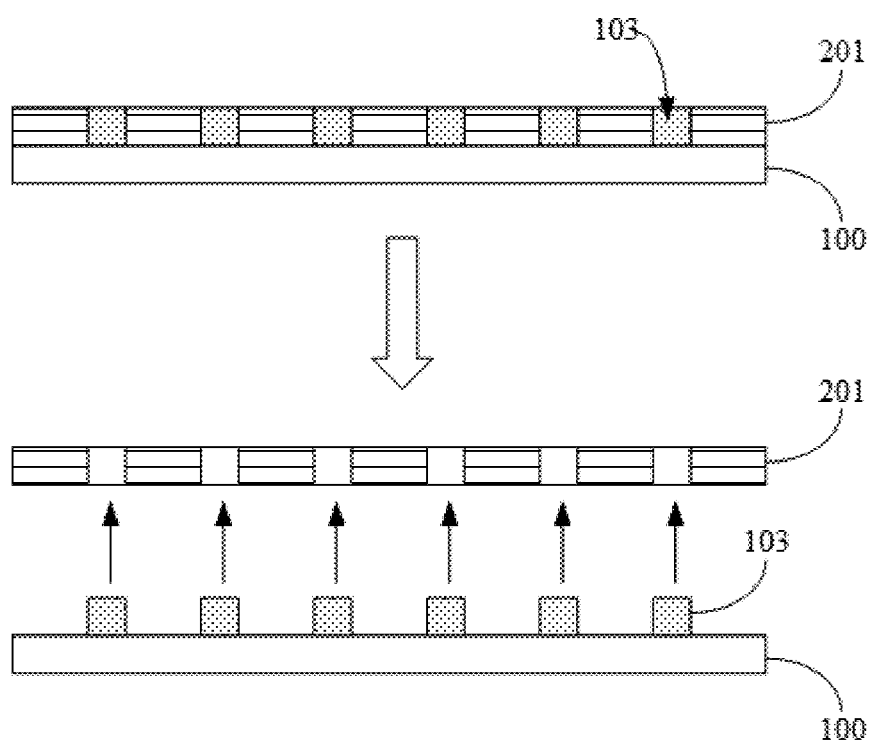
FIG. 3 is a partial step schematic diagram of a method for packaging stacking a flip chip provided in an embodiment of the present application.

As shown in the above figure in FIG. 3, fill the filling material 103 into the through hole 202 of the filling template 201; after the filling material 103 is formed, remove the filling template 201, as shown in the following figure in FIG. 3, to obtain the substrate 100 with the filling material 103. In this step A2, the filling material 103 is initially cured and formed. For example, the curing degree may be greater than 80%, a lower temperature and a faster heating rate may be used. Corresponding to different materials of filling material 103, a step temperature test may be used to find the appropriate temperature.

Step A3, placing a chip with solder balls on the substrate formed with the filling material, such that at least a portion of the solder balls in the solder balls being covered by the filling material.

Figure 4:
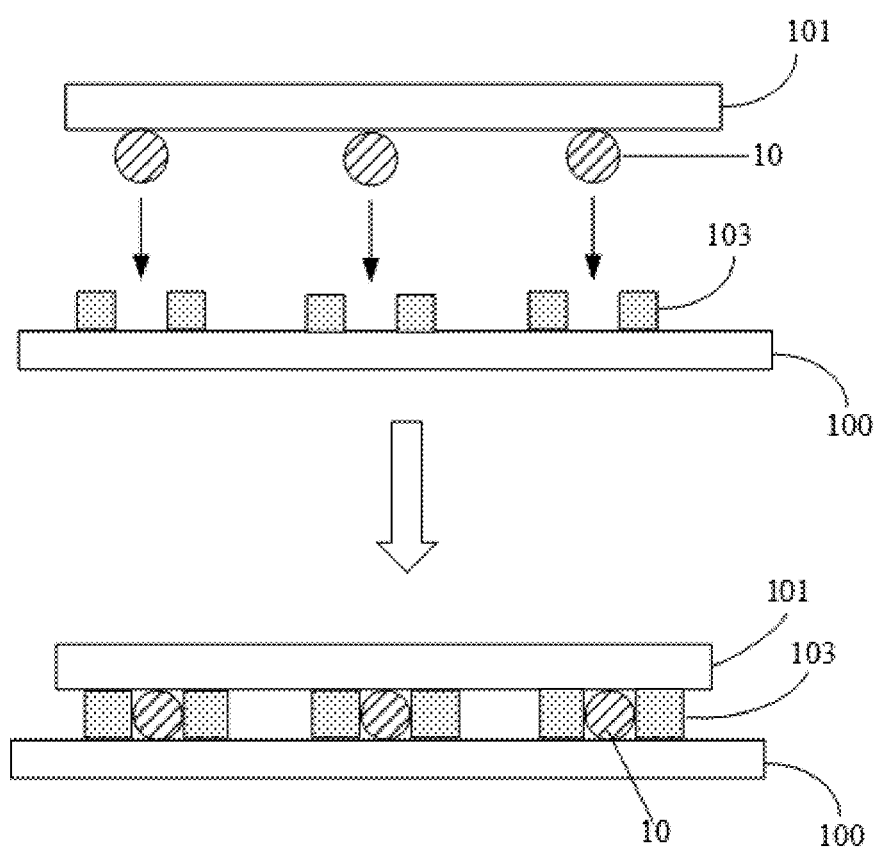
FIG. 4 is a partial step schematic diagram of a method for packaging stacking a flip chip provided in an embodiment of the present application.

As shown in the above figure in FIG. 4, place the chip 101 with the solder balls 10 onto the substrate 100 with the filling material 103, as shown in the following figure in FIG. 4, to obtain the chip 101 and the substrate 100 placed, that is, to make the chip 101 and the substrate 100 present a stacked posture. At this point, there is still a gap between the filling material 103 and the solder balls 10. When using reflow soldering technology to weld the substrate 100 and the solder balls 10, the filling material 103 will closely adhere to the solder balls 10. As shown in FIG. 4, there are multiple solder balls 10, and the filling material 103 forms multiple first filling bodies. The correspondence between the solder balls 10 and the filling material 103 is that one solder ball 10 is surrounded by a first filling body. In one case, each solder ball 10 is configured with a first filling body, and in another case, a portion number of solder balls 10 are configured with corresponding number of first filling bodies.

Figure 5:
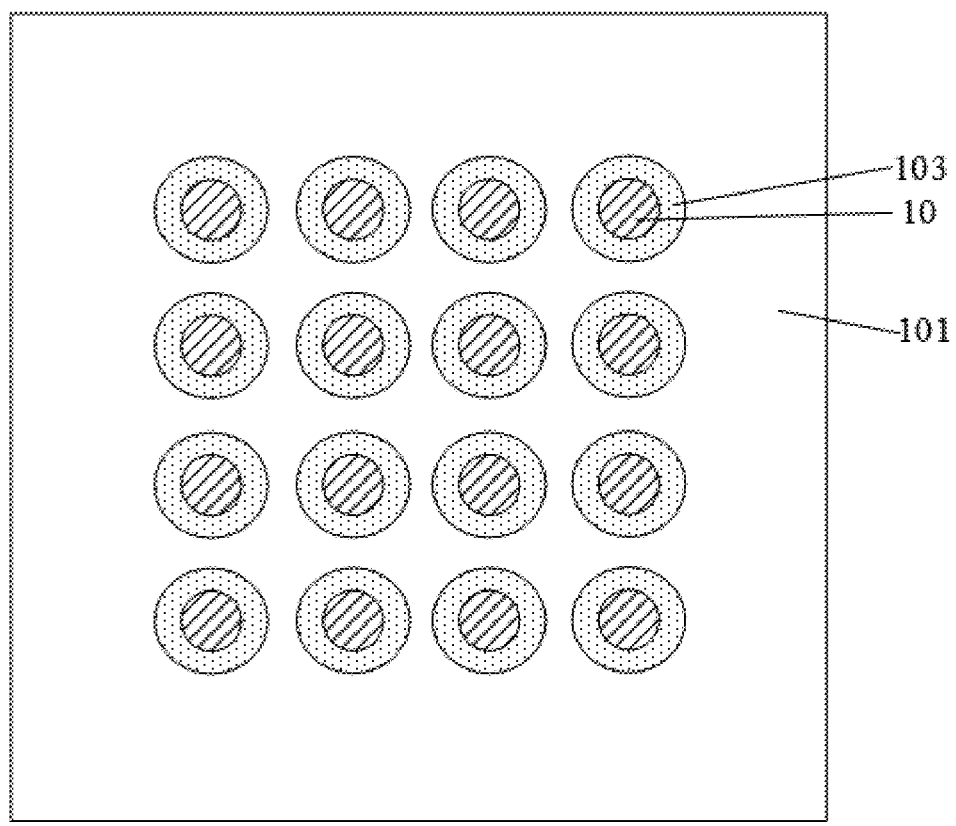
FIG. 5 is a schematic diagram of a coating state of solder balls on a front of a chip provided in an embodiment of the present application.

For example, in some possible implementations, as shown in FIG. 5, all solder balls 10 on the chip 101 are covered with the filler material 103. That is to say, each solder ball 10 is covered by a first filling body formed by the filling material 103.

Figure 6:
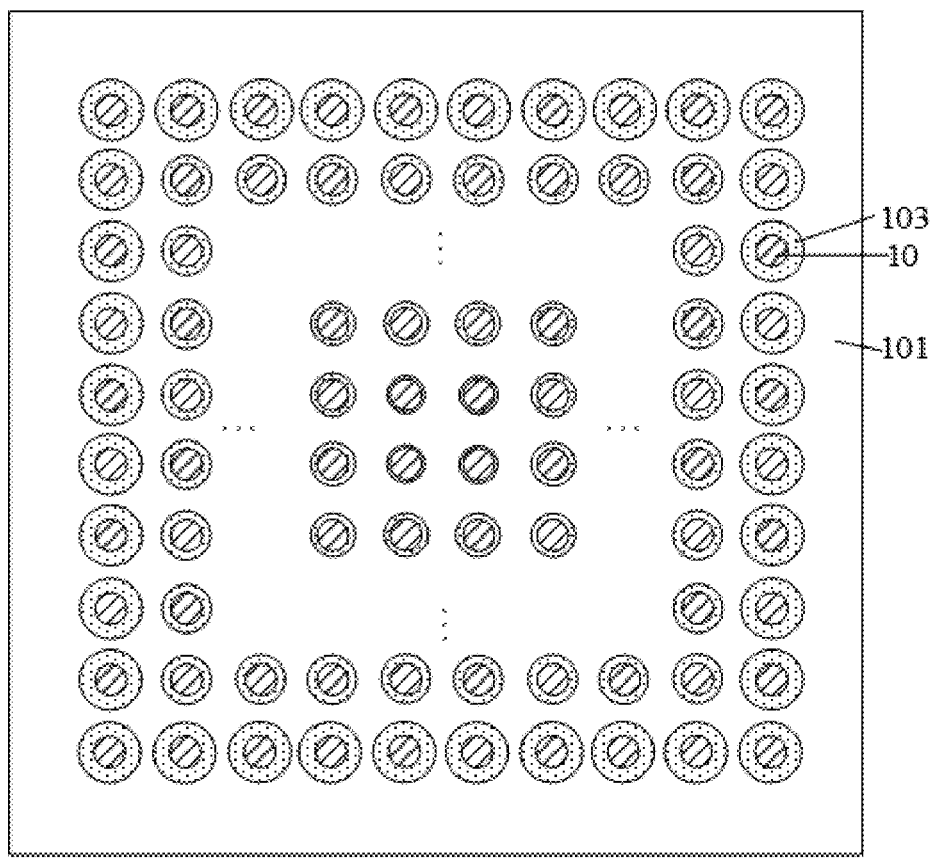
FIG. 6 is a schematic diagram of a coating state of solder balls on a front of a chip provided in another embodiment of the present application.

For example, in some possible implementations, as shown in FIG. 6, the thickness of the filling material 103 covering the solder balls 10 uniformly decreases from the periphery of the chip 101 to the middle of the chip 101. It is apparent to those of ordinary skill in the art that the thickness of the filling material 103 for each number of circles of solder balls 10 can gradually decrease from the outside to the inside, that is, there is a situation where the thickness of the filling material 103 for adjacent two or more circles of solder balls 10 remains unchanged.

It is apparent to those of ordinary skill in the art that all solder balls 10 on the chip 101 may be arranged in an array or in a circular pattern from the center to the outside. Based on this, the most periphery solder balls 10 refers to multiple solder balls 10 on the outermost circle, and the middle solder balls 10 refers to one or more solder balls 10 on the innermost circle. Moreover, the number of the most periphery solder balls 10 is greater than that of the middle solder balls 10. Due to the fact that all solder balls 10 are arranged in a multi circle shape, when referring to the periphery in the description, it refers to one or more circles from the outside to inside, but not the innermost circle. When mentioned in the description, the middle refers to one or more circles from the inside to outside, but not the outermost circle. After this explanation, when the terms "most periphery", "periphery", and "middle" appear in the description, the same explanation is used here.

Figure 7:
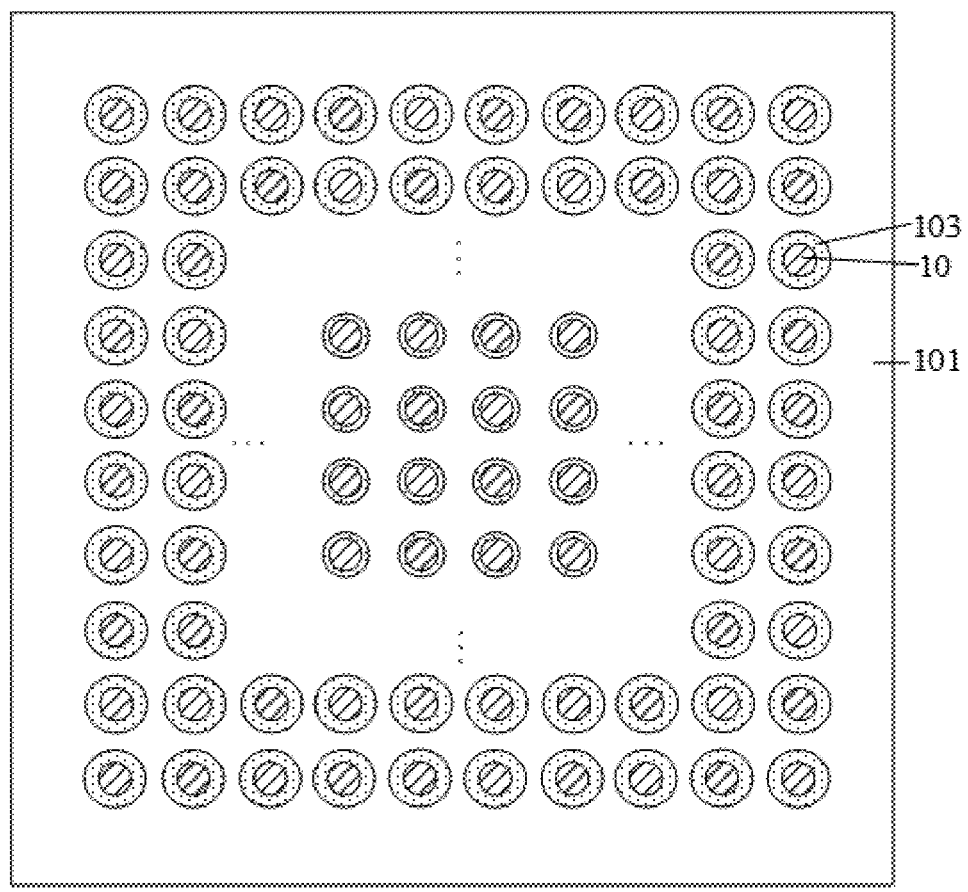
FIG. 7 is a schematic diagram of a coating state of solder balls on a front of a chip provided in another embodiment of the present application.

For example, in some possible implementations, as shown in FIG. 7, the thickness of the filling material 103 covering the solder balls 10 located on the periphery of the chip 101 is greater than that of the filling material 103 covering the solder balls 10 located in the middle of the chip 101. It is apparent to those of ordinary skill in the art that in this implementation, the thickness of the filling material 103 for adjacent two or more circles of solder balls 10 on the periphery may be a constant value, and the thickness of the filling material 103 for adjacent two or more circles of solder balls 10 in the middle may also be a constant value. From the periphery to the middle, the thickness of the filling material 103 for the outer circle of solder balls 10 is greater than that of the filling material 103 for the middle circle of solder balls 10.

Figure 8:
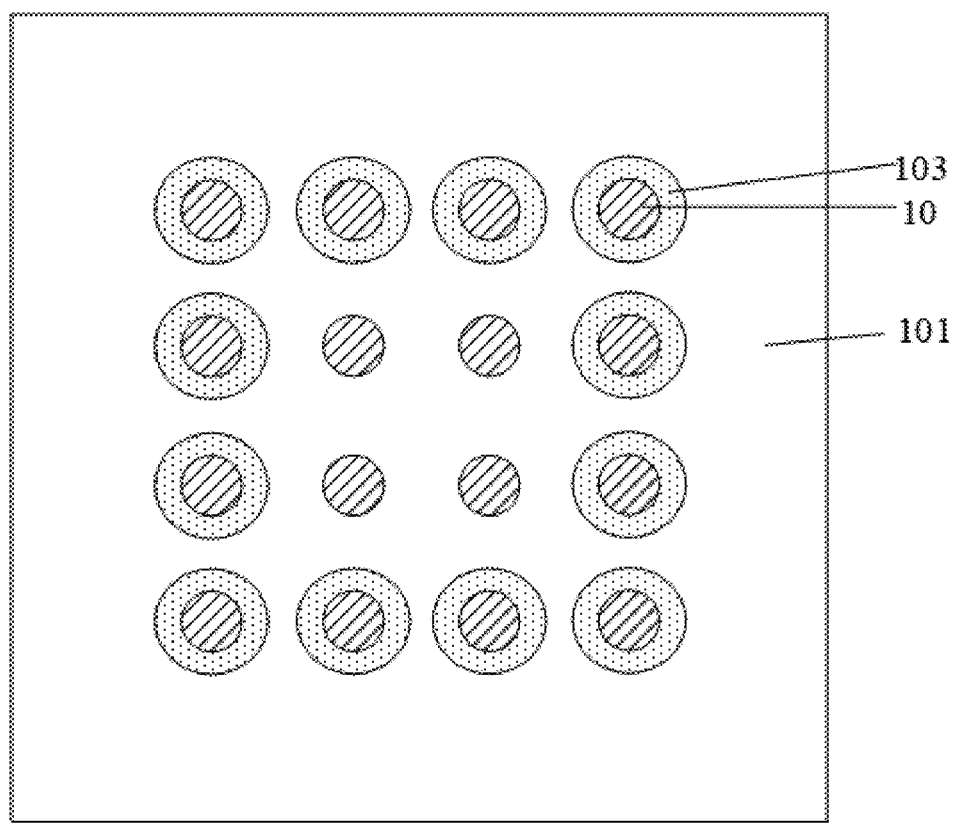
FIG. 8 is a schematic diagram of a coating state of solder balls on a front of a chip provided in another embodiment of the present application.

For example, in some possible implementations, as shown in FIG. 8, the solder balls 10 located on a periphery of the chip 101 are covered by the filling material 103, and the solder balls 10 located in a middle of the chip 101 are not covered by the filling material 103. It is apparent to those of ordinary skill in the art that in this implementation, the periphery one or more circles of solder balls 10 are covered by the first filling bodies formed by the filling material 103, while the middle one or more circles of solder balls 10 are not covered by the filling material 103.

Step A4, connecting the chip to the substrate through the solder balls, and curing the filling material with air gaps formed between the at least a portion of the solder balls covered with the filling material.

For example, the reflow soldering process may be used to solder the chip 101 and the substrate 100 together, and at this time, the filling material 103 will tightly adhere to the solder balls 10. In this step A4, the filling material 103 needs to form the final curing state, which may be achieved by using a higher temperature and a slower heating rate, and increasing the number of refluxes. Corresponding to different materials of filling material 103, a step temperature test may be used to find the appropriate temperature.

Figure 9:
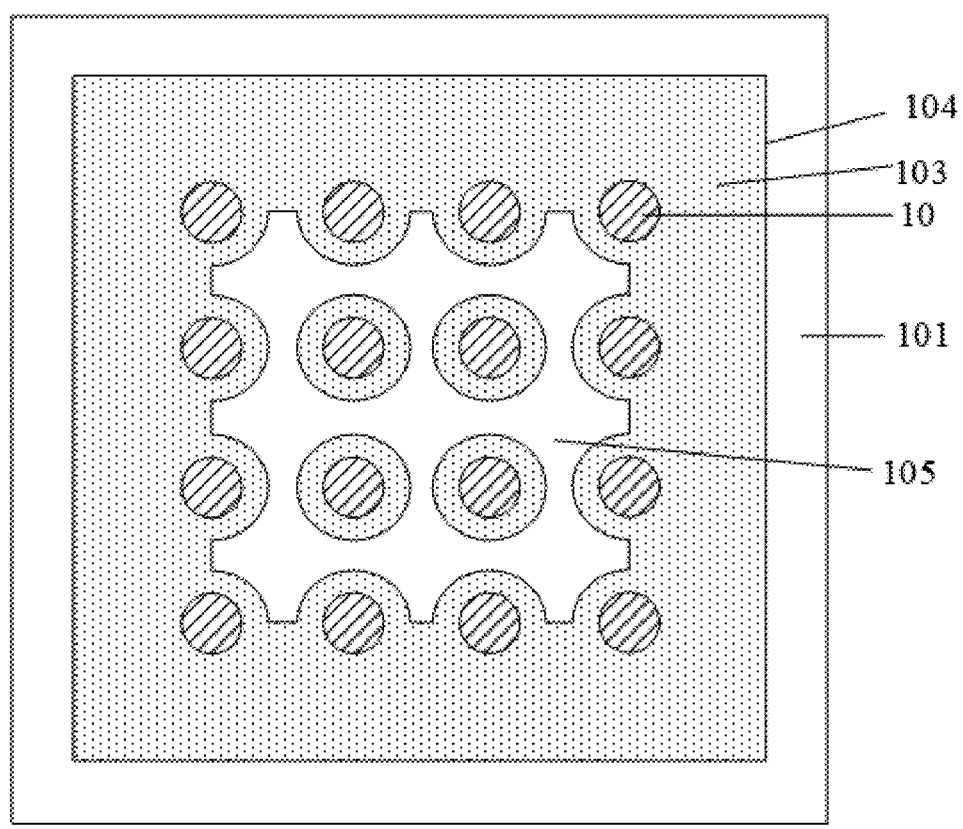
FIG. 9 is a schematic diagram of a coating state of solder balls on a front of a chip provided in another embodiment of the present application.
Figure 10:
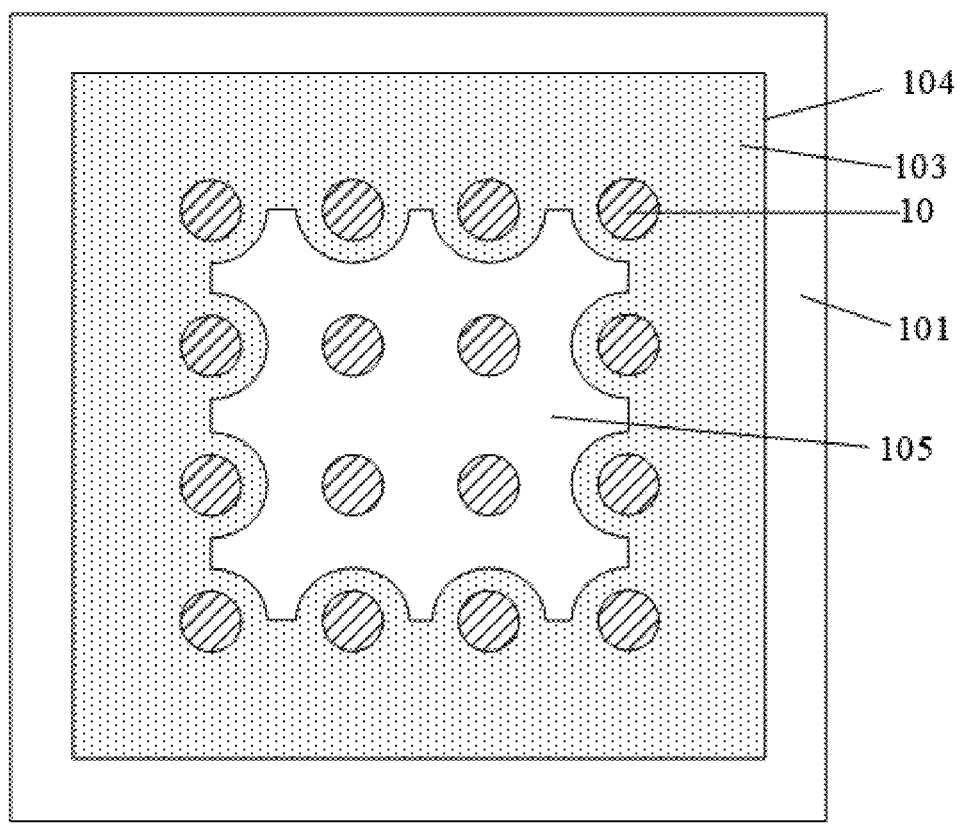
FIG. 10 is a schematic diagram of a coating state of solder balls on a front of a chip provided in another embodiment of the present application.

For example, as shown in FIGS. 9 and 10, after connecting the chip 101 to the substrate 100 through the solder balls 10, the method for packaging stacking the flip chip further includes:

filling a preset area 104 between the chip 101 and the substrate 100 with the filling material 103, such that an air cavity 105 is formed in a middle between the chip 101 and the substrate 100, the preset area 104 being an area between the solder balls 10 located on a most periphery and a boundary of the chip 101. This causes the filling material 103 to form a second filling body in the preset area 104. The solder balls 10 located on a most periphery can be understood as that the most periphery solder balls 10 are closest to the boundary of the chip 101.

Optionally, the above-mentioned substrate 100 may be a hard packaging substrate, such as any of polymer substrate, metal substrate, composite substrate, or ceramic substrate. In other embodiments, the substrate 100 may also be a flexible packaging substrate, and the material of the flexible packaging substrate may be either PI (polyimide) resin or PE (polyester) resin.

Optionally, the filling material 103 can disperse the thermal mechanical stress borne by the solder balls 10 onto the surface of the filling material 103, thereby reducing the thermal mechanical stress concentrated on the solder balls 10 and providing additional protection for the solder balls 10, thereby increasing their reliability.

Specifically, in some embodiments, the material of the filling material 103 may be a polymer composite material composed of one or more epoxy resin matrix mixed with reinforcing particles (particle materials such as silica, alumina, etc.), one or more curing agents, one or more promoters, and other additives. The material of the solder ball 10 may be tin lead alloy, copper zinc alloy, tin silver copper alloy, etc. In addition, the filling material 103 may be used with different materials on the same product according to different needs. Where, curing agents are substances used to enhance or control curing reactions, such as anhydride type substances, polymercaptans, phenolic formaledlyde type substances, polyamines, etc. Promoters are substances used to improve reaction efficiency, such as imidazole, DMP-30 (i.e. 2,4,6-tris (dimethylaminomethyl) phenol, molecular formula C15H27N3O), N, N-dimethylbenzylamine, etc.

Specifically, the proportion of the components of the filling material 103 will to some extent affect the high-frequency characteristics of the device. Therefore, in actual production, while designing the flip chip packaging structure with bottom filling material, the number, the shape, and the ratio of each type of the filling material 103 are fixed, making it easy to produce products in the frequency band corresponding to the design.

Specifically, the filling material 103 may cover each solder ball 10, and there is a gap between the filling material 103 corresponding to adjacent solder balls 10. By setting the filling material 103 to cover each solder ball 10, it can protect each solder ball 10, reduce the risk of the solder ball 10 falling off or breaking, and thus improve the overall reliability of the solder balls 10 located between the chip 101 and the substrate 100. At the same time, there is a certain air gap between the filling material 103 of adjacent solder balls 10, which means that there is no continuous filling material 103 between the filling materials 103 of adjacent solder balls 10, so that the air between the chip 101 and the substrate 100 is connected to the external environment. This not only reduces the RC delay of each solder ball 10 when transmitting signals, but also improves the performance of each solder ball 10 in transmitting signals, which can meet the communication needs of all solder balls 10 for high-frequency communication. At the same time, it is also conducive to the heat dissipation of the semiconductor packaging structure when operating in a thermal environment, and has good heat dissipation. Where, RC delay refers to the signal delay caused by the charging and discharging process of capacitor C controlled by resistor R in integrated circuits. It is apparent to those of ordinary skill in the art that when an air cavity 105 is not formed, the air between the chip 101 and the substrate 100 can be connected to the external environment. When an air cavity 105 is formed, due to the pore problem of the filling material 103 itself, the air between the chip 101 and the substrate 100 can still be connected to the external environment. The difference between the two is that when an air cavity 105 is formed, the periphery solder balls 10 are surrounded by the filling material 103, making it difficult for various external forces such as collisions, impacts, and squeezing to cause the solder balls 10 to fall off or break, thereby improving the structural strength of the semiconductor packaging structure. In actual production, the filling material 103 can be filled at appropriate positions based on the comprehensive requirements of dielectric performance, heat dissipation performance, structural strength, and other factors.

Specifically, for the middle solder balls 10 with a lower risk of failure, they can be made directly in contact with air. Due to the absence of filling material 103 for the solder balls 10 located in the middle, it is possible to achieve good high-frequency communication. Therefore, in some embodiments, the solder balls 10 with high requirements for high-frequency transmission performance may be set in the middle, so that the solder balls 10 located in the middle can play a good high-frequency communication effect.

Specifically, the cross-sectional shape of the filling material 103 can be circular. The cross-sectional shape of the filling material 103 specifically refers to the projected cross-section of the filling material 103 on the substrate 100. This allows the thermal mechanical stress of the solder balls 10 to be evenly distributed to the edge of the filling material 103 when the semiconductor packaging structure is in a thermal environment, reducing the impact of stress concentration on the solder balls 10. It is apparent to those of ordinary skill in the art that in other embodiments, the cross-sectional shape of the filling material 103 may also be other shapes, such as rectangles or other polygons.

Figure 11:
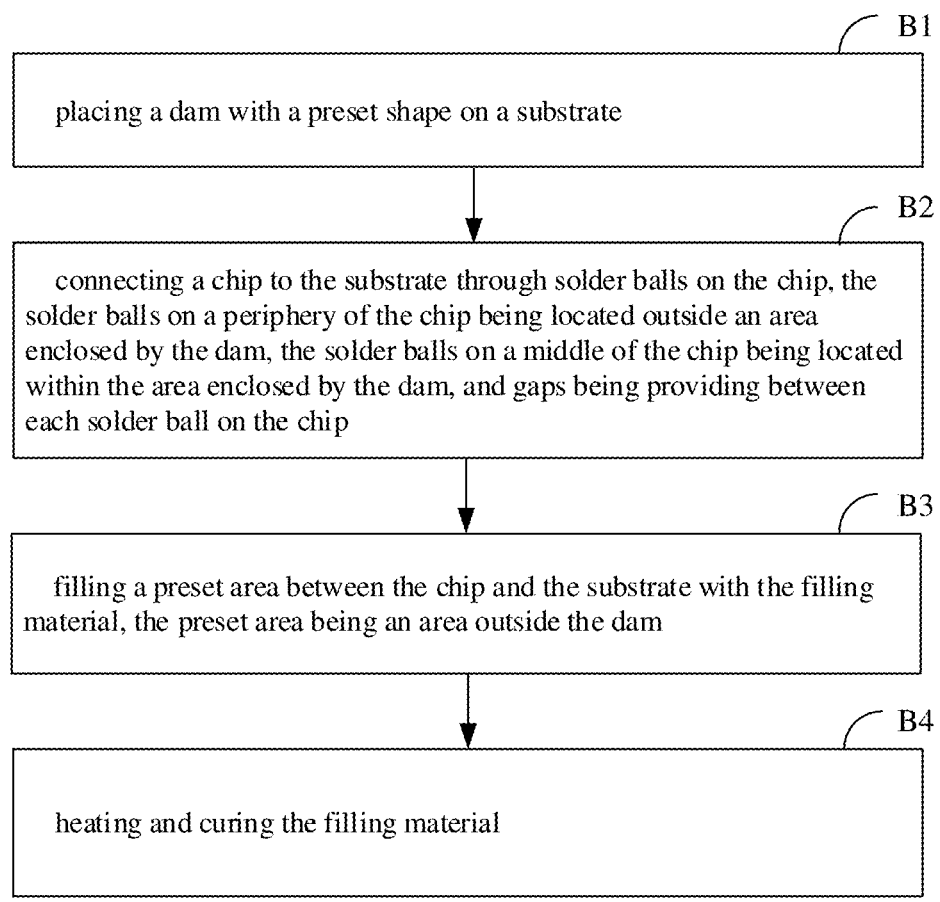
FIG. 11 is a flowchart of a method for packaging stacking a flip chip provided in another embodiment of the present application.

FIG. 11 is a schematic flowchart of a method for packaging stacking a flip chip provided in another embodiment of the present application. Referring to FIG. 11, a detailed description of the method for packaging stacking the flip chip is as follows:

Step B1, placing a dam with a preset shape on a substrate.

Step B2, connecting a chip to the substrate through solder balls on the chip, the solder balls located on a periphery of the chip being located outside an area enclosed by the dam, the solder balls located in a middle of the chip being located within the area enclosed by the dam, and gaps being providing between each solder ball on the chip.

Step B3, filling a preset area between the chip and the substrate with the filling material, the preset area being an area outside the dam.

Step B4, heating and curing the filling material.

It is apparent to those of ordinary skill in the art that after the filling material 103 solidifies, the filling material 103 solidifies to form several third filling bodies.

Figure 12:
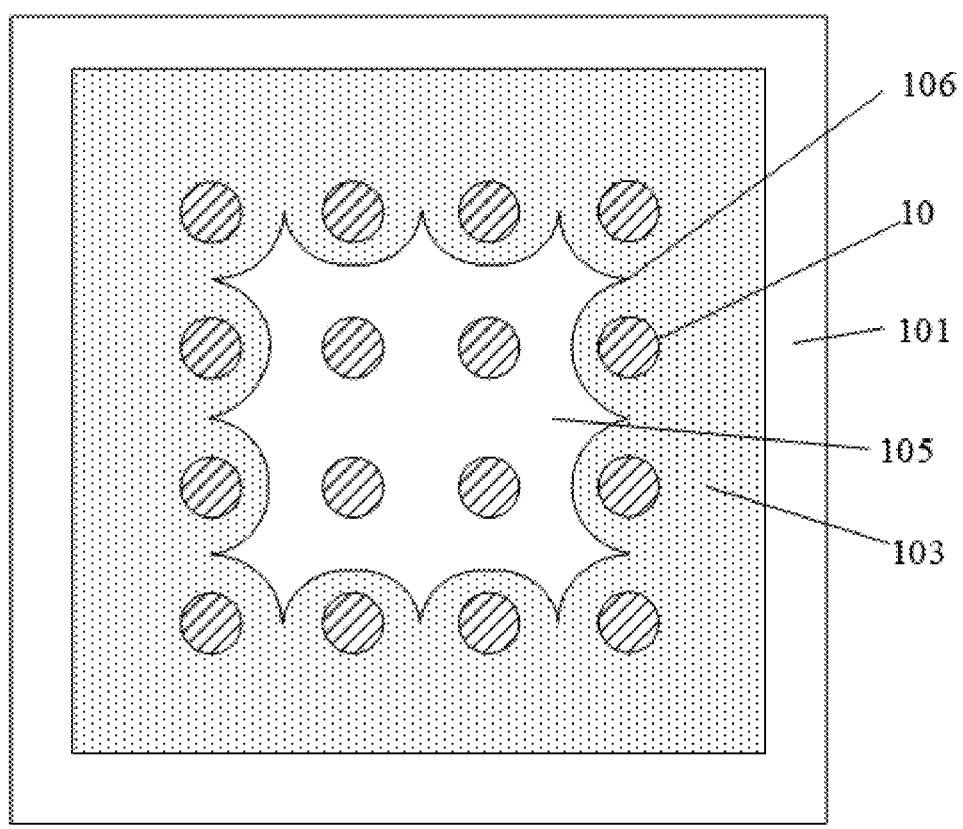
FIG. 12 is a schematic diagram of a coating state of solder balls on a front of a chip provided in another embodiment of the present application.

As an example, as shown in FIG. 12, due to the presence of the dam 106, when using flowable filling material 103 for filling, the filling material 103 will fill the external area of the dam 106, forming an air cavity 105.

It should be noted that the specific description of the substrate 100, the filling material 103, and the solder ball 10 in the method for packaging stacking the flip chip shown in FIG. 11 may refer to the specific description of the substrate 100, the filling material 103, and the solder ball 10 in the method for packaging stacking the flip chip shown in FIG. 1. The content of the two is the same and will not be repeated here.

Figure 13:
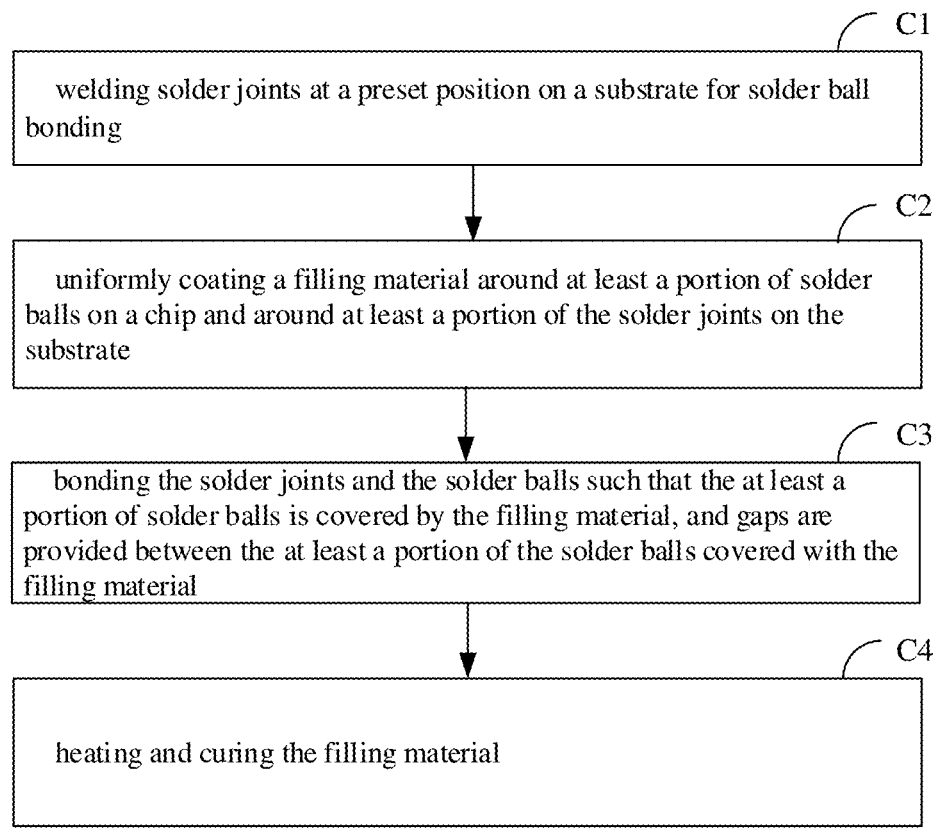
FIG. 13 is a flowchart of a method for packaging stacking a flip chip provided in another embodiment of the present application.

FIG. 13 is a schematic flowchart of a method for packaging stacking a flip chip provided in another embodiment of the present application. Referring to FIG. 13, a detailed description of the method for packaging stacking the flip chip is as follows:

Step C1, welding solder joints at a preset position on a substrate for solder ball bonding.

Step C2, uniformly coating a filling material around at least a portion of solder balls on a chip and around at least a portion of the solder joints on the substrate.

Figure 14:
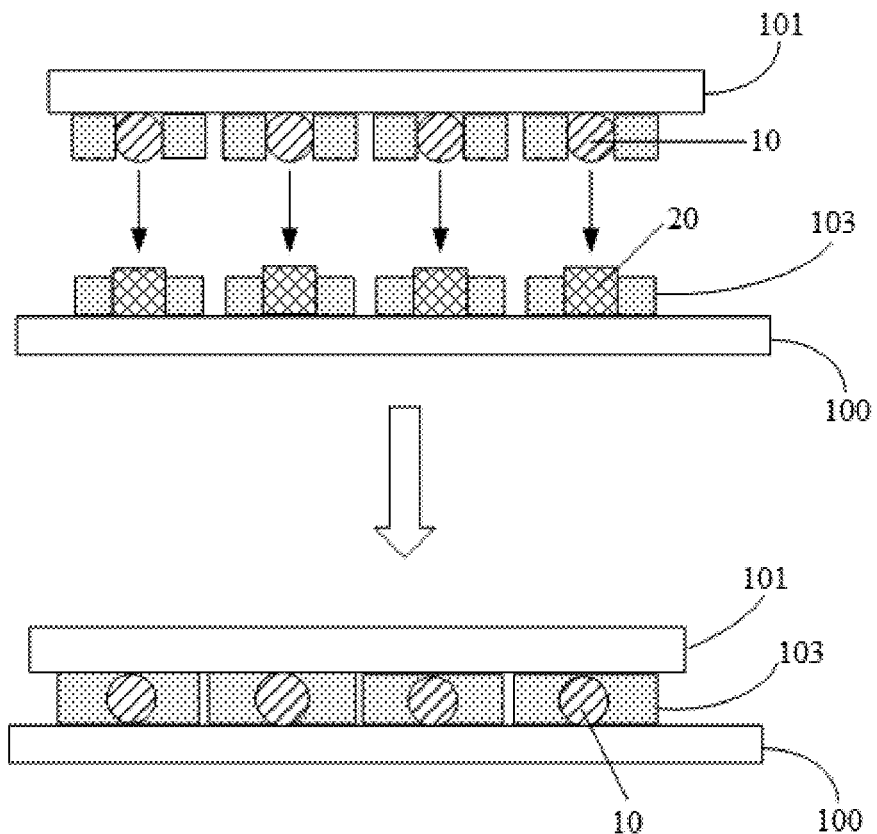
FIG. 14 is a schematic diagram of steps of a method for packaging stacking a flip chip provided in another embodiment of the present application.

As shown in the above figure in FIG. 14, at least a portion of the solder balls 10 on the chip 101 and at least a portion of the solder joints 20 on the substrate 100 are uniformly coated with the filling material 103. Where, at least a portion of the solder balls 10 may be a partial quantity of the solder balls 10, or a full quantity of the solder balls 10; at least a portion of the solder joints 20 may be a partial quantity of the solder joints 20, or a full quantity of the solder joints 20.

Figure 15:
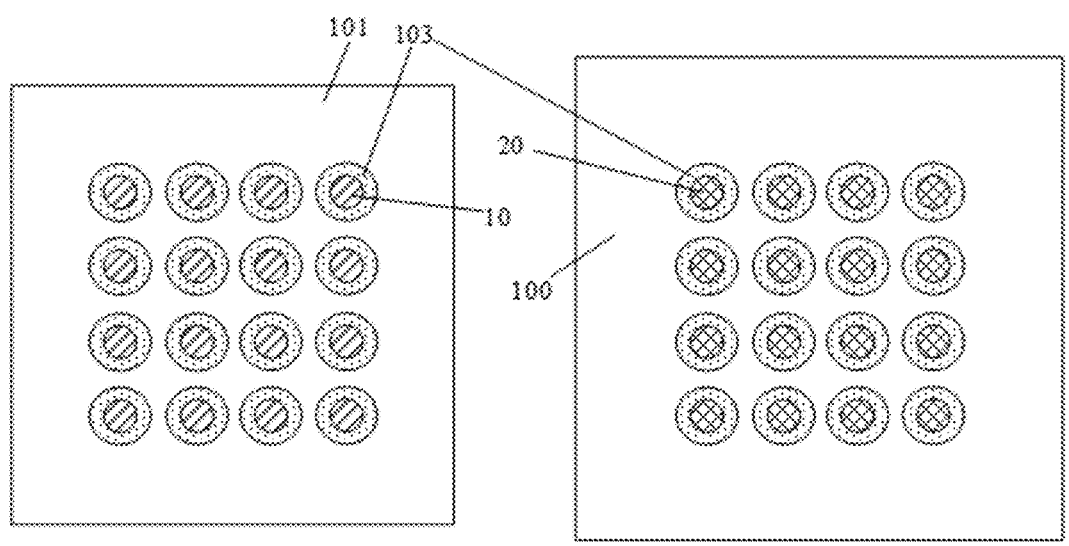
FIG. 15 is a schematic diagram of a coating state of solder balls on a front of a chip and a coating state of solder joints on a substrate provided in another embodiment of the present application.

For example, in some possible implementations, as shown in FIG. 15, all solder balls 10 on the chip 101 and all solder joints 20 on the substrate 100 are uniformly coated with filling material 103.

Figure 16:
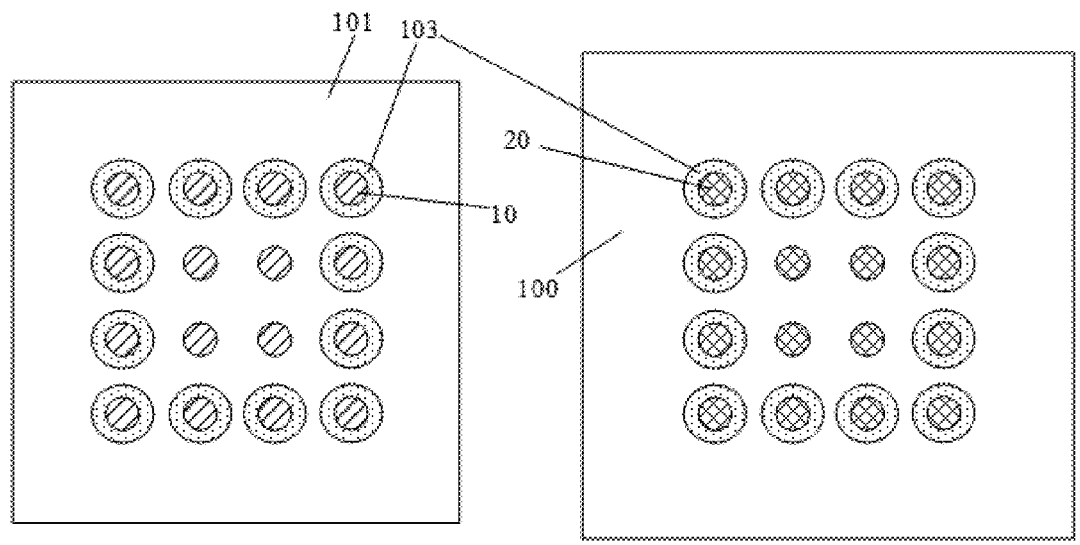
FIG. 16 is a schematic diagram of a coating state of solder balls on a front of a chip and a coating state of solder joints on a substrate provided in another embodiment of the present application.

For example, in some possible implementations, as shown in FIG. 16, the solder balls 10 located on a most periphery of the chip 101 and the solder joints 20 located on a most periphery of the substrate 100 are uniformly coated with the filling material 103, while the solder balls 10 located in a middle of the chip 101 and the solder joints 20 located in a middle of the substrate 100 are not coated with the filling material 103.

Figure 17:
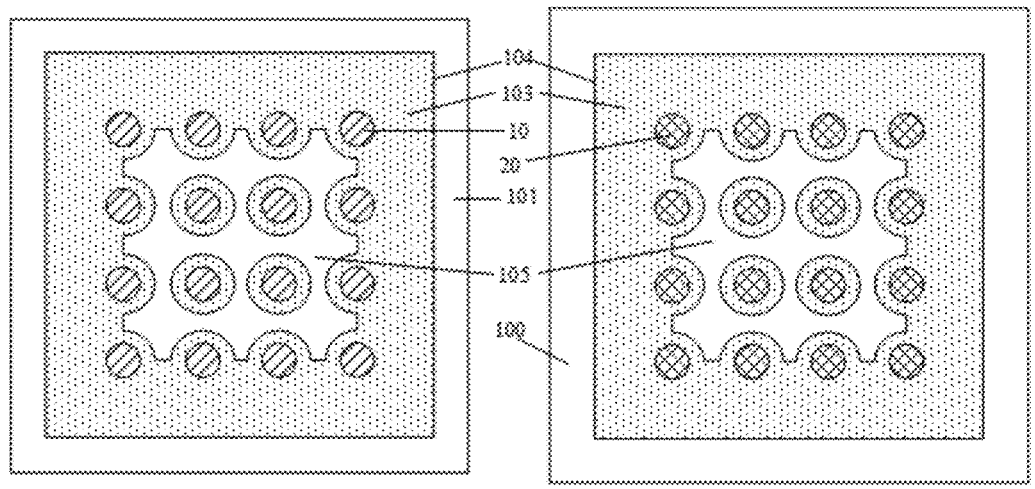
FIG. 17 is a schematic diagram of a coating state of solder balls on a front of a chip and a coating state of solder joints on a substrate provided in another embodiment of the present application.
Figure 18:
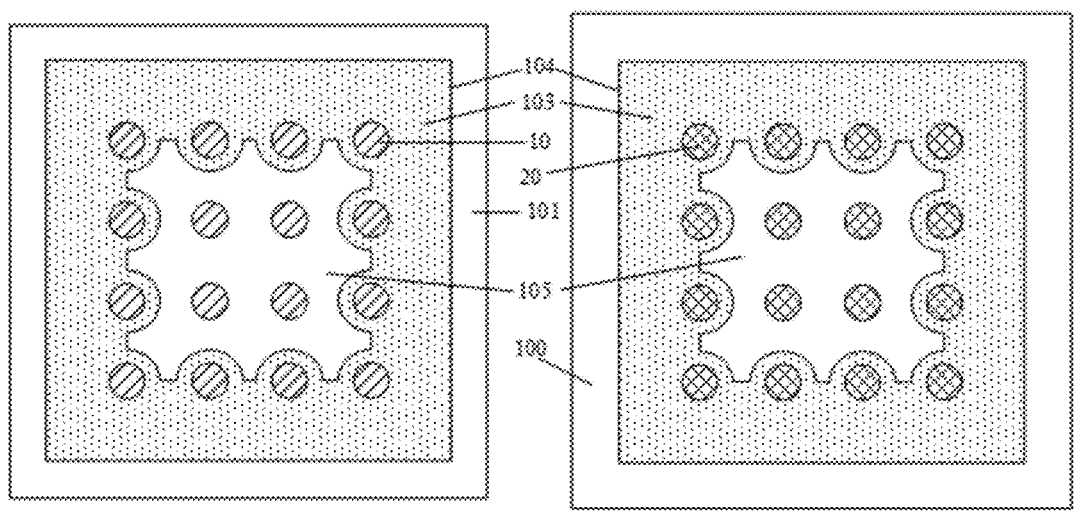
FIG. 18 is a schematic diagram of a coating state of solder balls on a front of a chip and a coating state of solder joints on a substrate provided in another embodiment of the present application.

For example, as shown in FIGS. 17 and 18, after heating and curing the filling material 103, the method for packaging stacking the flip chip further includes:

filling a preset area 104 between the chip 101 and the substrate 100 with the filling material 103, such that an air cavity 105 is formed in a middle between the chip 101 and the substrate 100, the preset area 104 being an area between the solder balls 10 located on a most periphery and a boundary of the chip 101. Where, the filling material 103 forms several fourth filling bodies in the preset area 104. The solder balls 10 located on a most periphery can be understood as that the most periphery solder balls 10 are closest to the boundary of the chip101.

Step C3, bonding the solder joints and the solder balls such that the at least a portion of the solder balls is covered by the filling material, and air gaps are provided between the at least a portion of the solder balls covered with the filling material.

As shown in the figure below in FIG. 14, each solder joint 20 and each solder ball 10 are bonded to obtain the structure shown in the figure below in FIG. 14. During the bonding process, the filling material 103 will fill the gap between the solder balls 10 and the filling material 103, making the filling material 103 tightly adhere to the solder balls 10. Where, the filling material 103 forms several fifth filling bodies around several solder balls 10. In this embodiment, bonding can be seen as welding.

Step C4, heating and curing the filling material.

In this step C4, the filling material 103 needs to form the final curing state, which may be achieved by using a higher temperature and a slower heating rate, and increasing the number of refluxes. Corresponding to different materials of filling material 103, a step temperature test may be used to find the appropriate temperature.

For example, in some possible implementations, the thickness of the filling material 103 covering the solder balls 10 uniformly decreases from the periphery of the chip 101 to the middle of the chip 101, and the thickness of the filling material 103 around the solder joints 20 on the substrate 100 is the same as that of the corresponding filling material 103 covering the solder balls 10.

For example, in some possible implementations, the thickness of the filling material 103 covering the solder balls 10 located on the periphery of the chip 101 is greater than that of the filling material 103 for the solder balls 10 located in the middle of the chip 101, and the thickness of the filling material 103 around the solder joints 20 on the substrate 100 is the same as that of the corresponding filling material 103 covering the solder balls 10.

It should be noted that the specific description of the substrate 100, the filling material 103, and the solder ball 10 in the method for packaging stacking the flip chip shown in FIG. 13 may refer to the specific description of the substrate 100, the filling material 103, and the solder ball 10 in the method for packaging stacking the flip chip shown in FIG. 1. The content of the two is the same and will not be repeated here.

The above methods for packaging stacking the flip chip not only improve the reliability of semiconductor packaging structures, but also enhance the electrical performance of high-frequency signals in semiconductor packaging structures, meeting the stringent requirements for semiconductor packaging structures in different environments, achieving a balance between reliability and electrical performance, making semiconductor packaging structures more able to withstand the test of practical production and life.

Based on the above content, the embodiments of the present application also provide a packaging stacking structure of a flip chip, including: a substrate 100, a chip 101, and multiple solder balls 10.

The substrate 100 and the chip 101 are stacked structures. Multiple solder balls 10 are arranged between the substrate 100 and the chip 101 in an array, and the chip 101 is electrically connected to the substrate 100 through the solder balls 10. At least some of the solder balls 10 among the multiple solder balls 10 are covered by the filling material 103, and there are gaps between the solder balls 10 covered by the filling material 103.

For example, in some possible implementations, all solder balls 10 among multiple solder balls 10 are covered by the filling material 103.

For example, in some possible implementations, the peripheral solder balls 10 among multiple solder balls 10 are covered by the filling material 103.

For example, in some possible implementations, the preset area 104 between the chip 101 and the substrate 100 is filled with filling material 103, forming an air cavity 105 in the middle between the chip 101 and the substrate 100. The preset area 104 is the area between the solder balls 10 on a most periphery and a boundary of the chip 101.

For example, in some possible implementations, a thickness of the filling material 103 is less than or equal to half of a difference between a distance between centers of two adjacent solder balls and a diameter of one solder ball.

Figure 19:
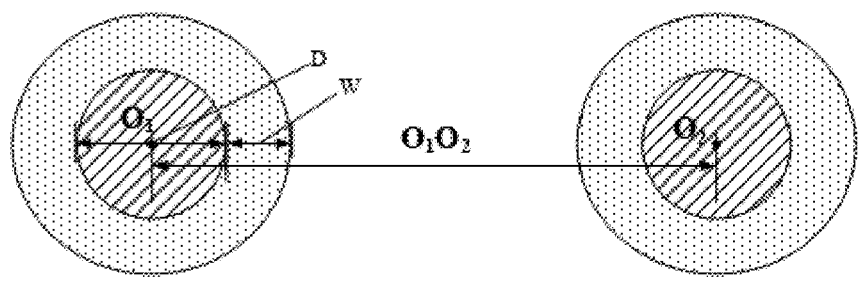
FIG. 19 is a schematic diagram of a thickness of a filling material between two adjacent solder balls provided in an embodiment of the present application.

Specifically, as shown in FIG. 19, the thickness of the filling material 103 is W, the distance between the centers of two adjacent solder balls 10, namely O1 and O2, is O1O2, and the diameter of the solder ball is D, which is $$W \leq \frac{O_1 O_2 - D}{2}.$$

Specifically, the smaller the thickness W of the filling material 103, the larger the gap between adjacent filling material 103, which means there is a larger air circulation space and can improve the signal transmission performance of solder ball 10. The smaller the thickness W of the filling material 103, the corresponding decrease in the protective effect on the solder ball 10. In actual production and life, the thickness W of the filling material 103 can be adjusted appropriately according to the specific application scenarios of the semiconductor packaging structure, in order to improve the utilization effect of the semiconductor packaging structure.

Figure 20:
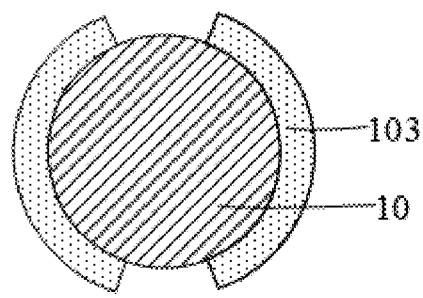
FIG. 20 is a schematic diagram of coating solder balls provided in an embodiment of the present application.
Figure 21:
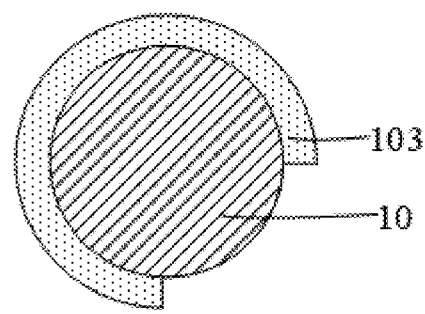
FIG. 21 is a schematic diagram of coating solder balls provided in another embodiment of the present application.

For example, in some possible implementation methods, the filling material 103 fully covers the solder ball 10, or as shown in FIGS. 20 and 21, according to actual production and life needs, the filling material 103 covers a part of the surface of the solder ball 10, while improving the reliability of the semiconductor packaging structure and the electrical performance of the high-frequency signal of the semiconductor packaging structure.

For example, in some possible implementations, as shown in FIGS. 20 and 21, the filling material 103 wrapped around the solder ball 10 may be partially surface coated in certain cases, as shown in FIG. 20, where the solder ball 10 is located in the middle of the chip 101. As shown in FIG. 21, the solder ball 10 is located at the most periphery of the chip 101, and the part of the solder ball 10 that is not covered with filling material 103 is far from the edge of the chip 101.

For example, in some possible implementations, the filling material 103 and the solder balls 10 are tightly fitted without gaps. In the actual production process, during the heating and curing process of the filling material 103, the filling material 103 will fill the small gap between the filling material 103 and the solder balls 10, making the filling material 103 and the solder balls 10 tightly fitted.

As an example, the three methods mentioned above only yield packaging structures for one layer of substrate 100 and one layer of chip 101. In actual production and daily life, a stacked packaging structure with a multi-layer chip 101 and one layer of substrate 100 can be obtained using any of the three methods mentioned above, with the bottom layer being substrate 100 and the upper layer of substrate 100 being multi-layer stacked chip 101.

Figure 22:
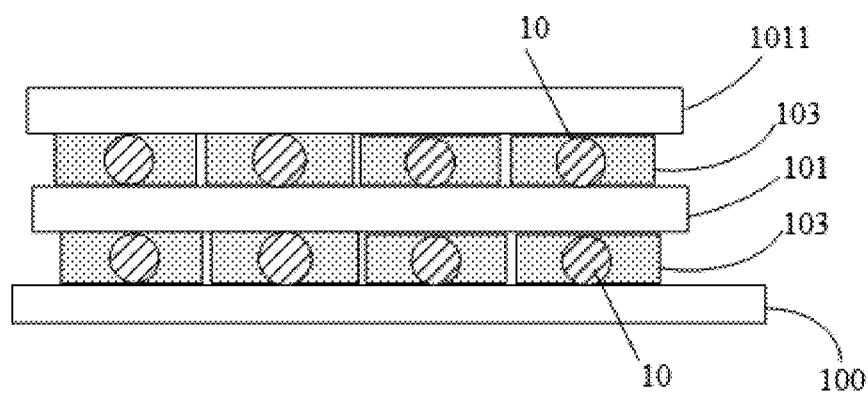
FIG. 22 is a schematic diagram of a multi-layer packaging stacking structure provided in another embodiment of the present application.

Specifically, as shown in FIG. 22, the packaging structure includes a bottom substrate 100, a middle layer chip 101, and a top layer chip 1011. After connecting the middle layer chip 101 to the bottom substrate 100 using any of the above three methods, the top layer chip 1011 may also be connected to the middle layer chip 101 using any of the above three methods. In other words, the substrate 100 of the above three methods may be replaced by the middle layer chip 101, and the chip 101 of the above three methods may be replaced by the top layer chip 1011. However, considering the difficulty of implementation in actual production, steps B1 to B4 are generally chosen to connect the top layer chip 1011 with the middle layer chip 101. When there are more chips 101, operator may also refer to any of the three methods mentioned above.

It is apparent to those of ordinary skill in the art that the size of the sequence numbers of each step in the above embodiments does not imply the order of execution. The execution order of each process should be determined by its function and internal logic, and should not constitute any limitation on the implementation process of embodiments of the present application.

The above embodiments are only used to illustrate the technical solution of the present application, and not to limit it. Although the present application has been described in detail with reference to the aforementioned embodiments, ordinary technical personnel in the art should understand that they can still modify the technical solutions recorded in the aforementioned embodiments, or equivalently replace some of the technical features therein. And these modifications or replacements do not separate the essence of the corresponding technical solutions from the spirit and scope of the technical solutions in each embodiment of the present application, and should be included in the scope of protection of the present application.

The invention claimed is:

1. A method for packaging stacking a flip chip, comprising:
   welding solder joints at a preset position on a substrate for solder ball bonding;
   uniformly coating a filling material around at least a portion of solder balls on a chip and around at least a portion of the solder joints on the substrate to form a first filling body, the filling material being a polymer composite material comprising an epoxy resin matrix, a curing agent, and a promoter;
   bonding the solder joints and the solder balls such that the at least a portion of the solder balls is covered by the first filling body, and gaps are provided between the at least a portion of the solder balls covered with the first filling body; and
   heating and curing the first filling body, and after heating and curing the first filling body, the method further comprises:
   filling a preset area between the chip and the substrate with the filling material, such that an air cavity is formed in a middle between the chip and the substrate, the preset area being an area between the solder balls located on a most periphery and a boundary of the chip.

2. The method according to claim 1, wherein the solder balls on the chip and the solder joints on the substrate are uniformly coated with the filling material.

3. The method according to claim 1, wherein the solder balls located on a most periphery of the chip and the solder joints located on a most periphery of the substrate are uniformly coated with the filling material, and the solder balls located in a middle of the chip and the solder joints located in a middle of the substrate are not coated with the filling material.

* * * * *